US009918388B2

(12) United States Patent
Asami (10) Patent No.: US 9,918,388 B2
(45) Date of Patent: Mar. 13, 2018

(54) CIRCUIT SUBSTRATE, METHOD OF MANUFACTURING CIRCUIT SUBSTRATE, AND ELECTRONIC COMPONENT

(71) Applicant: Sony Corporation, Tokyo (JP)

(72) Inventor: Hiroshi Asami, Tokyo (JP)

(73) Assignee: SONY CORPORATION, Tokyo (JP)

( * ) Notice: Subject to any disclaimer, the term of this patent is extended or adjusted under 35 U.S.C. 154(b) by 602 days.

(21) Appl. No.: 14/133,074

(22) Filed: Dec. 18, 2013

(65) Prior Publication Data

US 2014/0191382 A1     Jul. 10, 2014

(30) Foreign Application Priority Data

Jan. 9, 2013    (JP) .................... 2013-001853

(51) Int. Cl.
| | |
|---|---|
| H01L 23/495 | (2006.01) |
| H05K 3/10 | (2006.01) |
| H01L 23/00 | (2006.01) |
| H01L 23/498 | (2006.01) |
| H01L 21/48 | (2006.01) |
| H05K 1/11 | (2006.01) |
| H01L 21/56 | (2006.01) |
| H05K 3/34 | (2006.01) |

(52) U.S. Cl.
CPC ......... *H05K 3/108* (2013.01); *H01L 21/4853* (2013.01); *H01L 23/49816* (2013.01); *H01L 23/49838* (2013.01); *H01L 24/81* (2013.01); *H05K 3/3478* (2013.01); *H01L 21/563* (2013.01); *H01L 2224/73204* (2013.01); *H01L 2924/12042* (2013.01); *H05K 1/111* (2013.01); *H05K 3/3436* (2013.01); *H05K 3/3452* (2013.01); *H05K 2201/099* (2013.01); *H05K 2201/10977* (2013.01); *Y10T 29/49155* (2015.01)

(58) Field of Classification Search
CPC ... H01L 2924/15311; H01L 2224/0401; H01L 2924/1532; H01L 24/81; H01L 23/49816; H01L 23/49838; H01L 21/4853; H05K 3/108; H05K 3/3478
USPC .................................................. 257/676, 672
See application file for complete search history.

(56) References Cited

U.S. PATENT DOCUMENTS

| | | | |
|---|---|---|---|
| 6,387,714 B1* | 5/2002 | Farnworth | H01L 23/32 257/E23.072 |
| 8,350,393 B2* | 1/2013 | Chen | H01L 22/32 257/15 |
| 2010/0013070 A1* | 1/2010 | Lee | H01L 23/4334 257/676 |
| 2010/0301472 A1* | 12/2010 | Migita | H01L 24/11 257/737 |

FOREIGN PATENT DOCUMENTS

| | | |
|---|---|---|
| JP | 3362079 | 1/2003 |
| JP | 3420076 | 6/2003 |

\* cited by examiner

*Primary Examiner* — Long Pham
(74) *Attorney, Agent, or Firm* — Chip Law Group (57) ABSTRACT

A circuit substrate includes: a mounting region having an exposed surface that is planarized, and in which a predetermined chip is to be mounted; patterns provided in the mounting region, and including respective top faces that form a part of the exposed surface; and solder bumps provided on the respective patterns, and having substantially same shape as one another.

7 Claims, 9 Drawing Sheets

(1) PREPROCESSING (2) RESIST TREATMENT (3) EXPOSURE AND DEVELOPMENT

FIG. 8

(4) SOLDER PARTICLE FILLING (5) REFLOW TREATMENT (6) RESIST REMOVAL AND CLEANING

CIRCUIT SUBSTRATE, METHOD OF MANUFACTURING CIRCUIT SUBSTRATE, AND ELECTRONIC COMPONENT

CROSS REFERENCES TO RELATED APPLICATIONS

The present application claims priority to Japanese Priority Patent Application JP 2013-001853 filed in the Japan Patent Office on Jan. 9, 2013, the entire content of which is hereby incorporated by reference.

BACKGROUND

The present application relates to a circuit substrate, a method of manufacturing such a circuit substrate, and an electronic component, and more specifically to a circuit substrate that is suitable for use in performing a flip-chip mounting, a method of manufacturing such a circuit substrate, and an electronic component.

A flip-chip mounting has been utilized as one of methods for mounting a chip such as an LSI on a circuit substrate. Further, as one of flip-chip mounting methods, a method has been in use that forms solder bumps on a circuit substrate side for connection with terminals on a chip side (for example, see Japanese Patent Nos. 3420076 and 3362079). Formation of solder bumps on a circuit substrate allows a chip to be mounted on a circuit substrate at lower loading even in the event of variation in the heights of circuit substrate patterns as compared with a case where solder bumps are formed on front edges of chip terminals.

Further, the technologies that are mentioned in Japanese Patent Nos. 3420076 and 3362079 have been elaborated to increase the accuracy of positioning and shapes of solder bumps to be formed on a circuit substrate. More specifically, Japanese Patent No. 3420076 has proposed a method in which connection pads of width greater than any other portion are formed on a wiring pattern, and solder bumps are formed on such connection pads. On the other hand, Japanese Patent No. 3362079 has proposed a method in which an adhesive film is formed on a circuit substrate pattern, and solder bumps are formed in a manner of giving attachment of solder powder to such a film and applying heat thereto.

SUMMARY

In the technologies that are mentioned in Japanese Patent Nos. 3420076 and 3362079, however, since solder bumps are formed in accordance with shapes of connection pads or a pattern, any difference in such shapes would cause variation in the shapes of the solder bumps, resulting in uneven heights being found. Consequently, this makes it difficult to connect some chip terminals with solder bumps in performing a flip-chip mounting, which may deteriorate the quality of electronic components to be manufactured in a flip-chip mounting method.

It is desirable to provide a technology that improves the quality of electronic components to be manufactured in a flip-chip mounting method.

A circuit substrate according to an embodiment of the present application includes: a mounting region having an exposed surface that is planarized, and in which a predetermined chip is to be mounted; patterns provided in the mounting region, and including respective top faces that form a part of the exposed surface; and solder bumps provided on the respective patterns, and having substantially same shape as one another.

Advantageously, the circuit substrate may be manufactured by: planarizing a surface of the mounting region; covering the mounting region with a resist; forming openings on the resist in alignment with respective locations on the patterns where respective terminals of the chip are to be connected, the openings having same shape as one another; filling solder particles into the openings, the solder particles each having a diameter that is smaller than a diameter of each of the openings; melting the solder particles to form the solder bumps in the openings; and removing the resist.

Advantageously, the circuit substrate may further include a solder resist provided at a circumferential portion of a mounting side of the circuit substrate to surround a periphery of the mounting region.

A method of manufacturing a circuit substrate according to an embodiment of the present application includes: planarizing a surface of a mounting region in which a predetermined chip is to be mounted to expose top faces of respective patterns in the mounting region; covering the mounting region with a resist; forming openings on respective portions, of the resist, that cover the respective patterns, the openings having same shape as one another; filling solder particles into the openings, the solder particles each having a diameter that is smaller than a diameter of each of the openings; melting the solder particles to form the solder bumps in the openings; and removing the resist.

Advantageously, surfaces of the solder particles may be coated with a flux, and the melting the solder particles may be carried out under a nitrogen atmosphere.

An electronic component according to an embodiment of the present application is provided with a chip and a circuit substrate, in which the chip is provided with terminals, and the circuit substrate is mounted with the chip. The circuit substrate includes: a mounting region having an exposed surface that is planarized, and in which a predetermined chip is mounted; patterns provided in the mounting region, and including respective top faces that form a part of the exposed surface; and solder bumps provided on locations, on the respective patterns, that correspond to the respective terminals of the chip, and having substantially same shape as one another.

Advantageously, the circuit substrate may be manufactured by: planarizing a surface of the mounting region; covering the mounting region with a resist; forming openings on the resist in alignment with the respective locations on the patterns, the openings having same shape as one another; filling solder particles into the openings, the solder particles each having a diameter that is smaller than a diameter of each of the openings; melting the solder particles to form the solder bumps in the openings; and removing the resist.

In the circuit substrate according to the above-described embodiment of the present application, respective terminals of the chip are to be connected with the solder bumps of the circuit substrate.

In the method of manufacturing the circuit substrate according to the above-described embodiment of the present application, the surface of the mounting region in which the predetermined chip is to be mounted is planarized to expose the top faces of the respective patterns in the mounting region. The mounting region is covered with the resist. The openings are formed on the respective portions, of the resist, that cover the respective patterns, in which the openings have the same shape as one another. The solder particles are filled into the openings, in which the solder particles each have the diameter that is smaller than the diameter of each of the openings. The solder particles are melted to form the solder bumps in the openings. The resist is removed.

In the electronic component according to the above-described embodiment of the present application, the respective terminals of the chip are connected with the solder bumps of the circuit substrate.

According to the circuit substrate or the electronic component of the above-described embodiment of the present application, it is possible to improve the quality of an electronic component that is manufactured in a flip-chip mounting method.

According to the method of manufacturing the circuit substrate of the above-described embodiment of the present application, the circuit substrate is manufactured. Further, use of the manufactured circuit substrate allows to improve the quality of an electronic component that is manufactured in a flip-chip mounting method.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the present disclosure, and are incorporated in and constitute a part of this specification. The drawings illustrate embodiments and, together with the specification, serve to explain the principles of the present application.

(1), (2), and (3) of FIG. 8 each show a manufacturing step for the circuit substrate.

(4), (5), and (6) of FIG. 9 each show a manufacturing step for the circuit substrate.

DETAILED DESCRIPTION

Hereinafter, some embodiments of the present application (hereinafter may be referred to as embodiment) are described. It is to be noted that the descriptions are provided in the order given below.

1. Embodiment of Electronic Component Employing Present application
2. Method of Manufacturing Circuit Substrate
3. Modification Examples 1. Embodiment of Electronic Component Employing Present Application First, with reference to FIG. 1 through FIG. 7, the description is provided on an embodiment of an electronic component employing the present application.

1-1. Configuration Example of Chip 100

Figure 1:
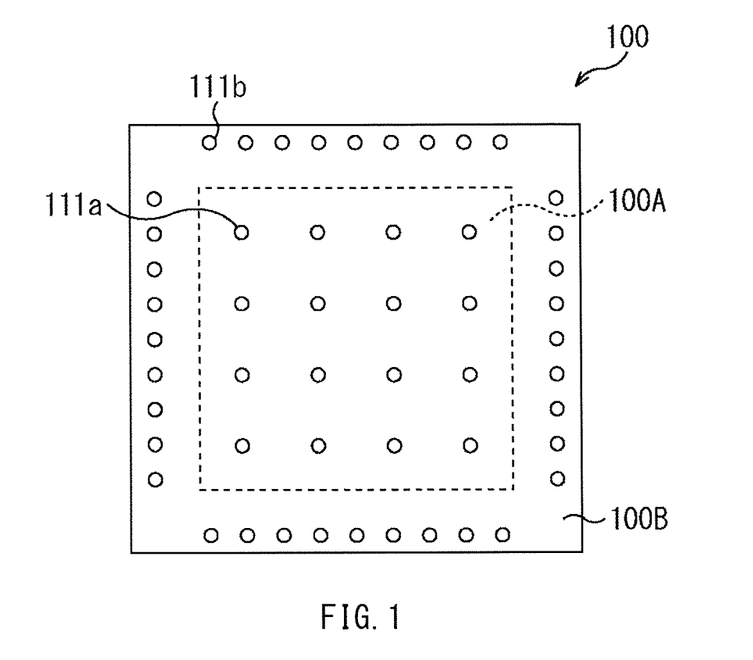
FIG. 1 is a diagram schematically showing a backside of a chip.

FIG. 1 is a diagram schematically showing a backside of a chip 100 that configures an electronic component employing the present application, according to one embodiment. It is to be noted that reference numerals for area terminals 111a and peripheral terminals 111b are omitted in part in the drawing for the purpose of simplifying the drawing.

A backside of the chip 100 is mainly divided into two regions of a central square-shaped area section 100A and a peripheral section 100B that surrounds a periphery of the area section 100A.

The area section 100A is provided with the area terminals 111a that are arranged in a grid-like pattern at regular spacing intervals. A pitch between each of the area terminals 111a may be, for example, about 130 µm.

The peripheral section 100B is provided with the peripheral terminals 111b that are laid out in a line at regular spacing intervals along each side of the chip 100. A pitch between each of the peripheral terminals 111b may be, for example, about 100 µm.

Figure 2:
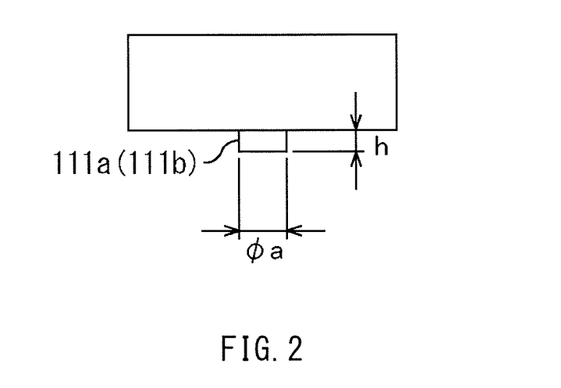
FIG. 2 is a side view of an area terminal or a peripheral terminal as viewed from a lateral side.

FIG. 2 is a side view of the area terminal 111a or the peripheral terminal 111b that is viewed from a lateral side. The area terminal 111a and the peripheral terminal 111b may be configured of cylindrical metal bumps that have the same shape and the same material as one another. Each of the area terminal 111a and the peripheral terminal 111b may be, for example, about 30 µm in diameter φa and about 15 µm in height h.

It is to be noted that each of the area terminal 111a and the peripheral terminal 111b is hereinafter simply called a terminal 111 in a case where it is not necessary to distinguish such terminals individually.

1-2. Configuration Example of Circuit Substrate 200

Figure 3:
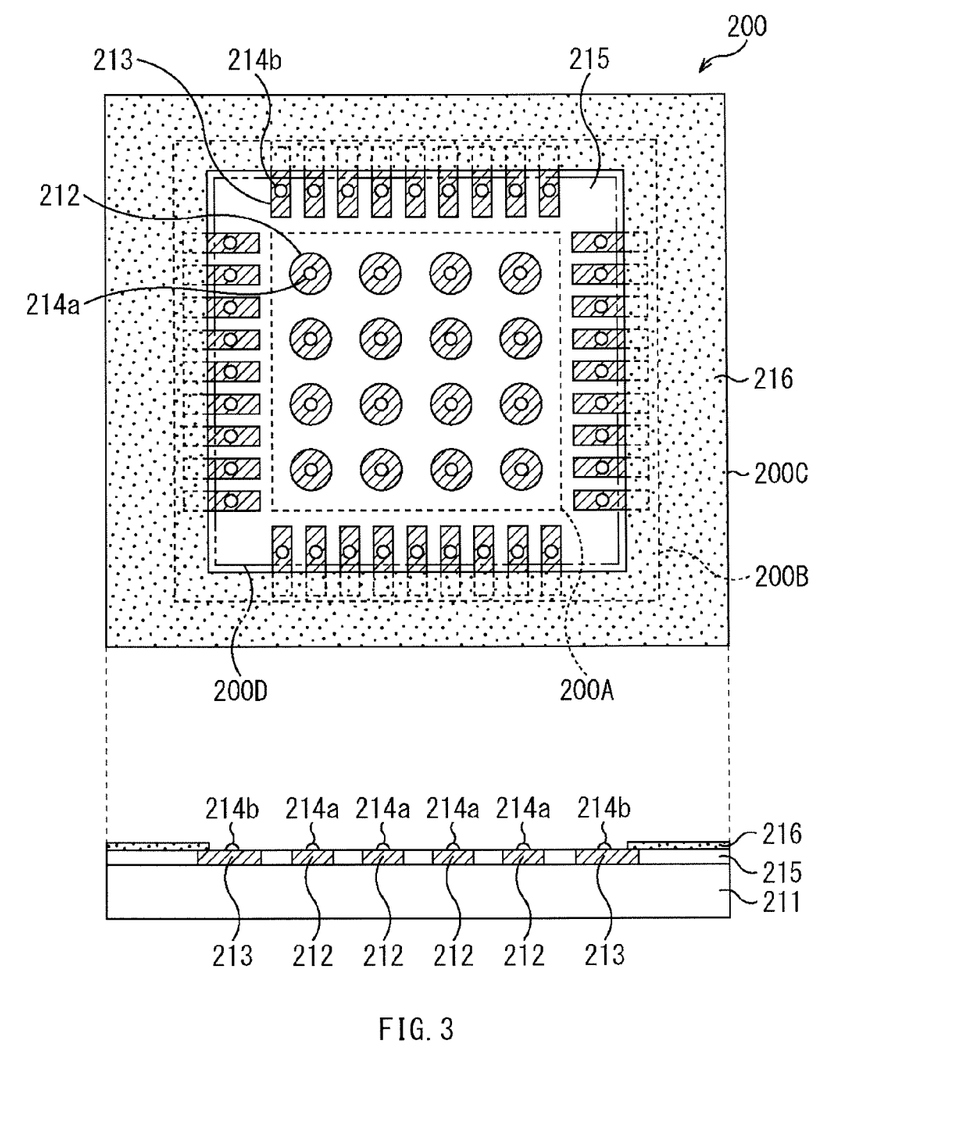
FIG. 3 is a schematic diagram showing a configuration example of a circuit substrate.

FIG. 3 shows a configuration example of a circuit substrate 200 that configures the electronic component employing the present application and on which the chip 100 is mounted, according to one embodiment. The upside drawing in FIG. 3 is a schematic diagram of the circuit substrate 200 that is viewed from topside, while the downside drawing is a schematic cross-sectional view of the circuit substrate 200. It is to be noted that reference numerals for lands 212, pads 213, solder bumps 214a, and solder bumps 214b are omitted in part in the drawing for the purpose of simplifying the drawing.

A mounting side of the circuit substrate 200 on which the chip 100 is to be mounted is mainly divided into a central square-shaped area section 200A, a peripheral section 200B that surrounds a periphery of the area section 200A, and a circumferential section 200C at an outermost side. It is to be noted that the area section 200A is a region corresponding to the area section 100A of the chip 100, and has the same area as the area section 100A. The peripheral section 200B is a region corresponding to the peripheral section 100B of the chip 100, and is wider in area than the peripheral section 100B. Further, the chip 100 is mounted at a mounting region 200D that is denoted with a two-dot chain line on the mounting side in the drawing. Therefore, a mounting region 200D becomes substantially equivalent to a size of the chip 100.

In the area section 200A, a plurality of circular lands 212 are formed on a base substrate 211. The lands 212 are laid out to be arranged in a grid-like pattern in alignment with the respective area terminals 111a of the chip 100. A pitch between each of the lands 212 may be, for example, about 130 μm.

A solder bump 214a is formed in the center of a surface of each of the lands 212. The solder bumps 214a have substantially the same shape as one another. The solder bumps 214a are laid out to be arranged in a grid-like pattern at locations for connecting the respective area terminals 111a of the chip 100.

In the peripheral section 200B, a plurality of rectangular pads 213 are formed on the base substrate 211. The pads 213 are arranged in parallel at regular spacing intervals along each side of the peripheral section 200B, in alignment with the respective peripheral terminals 111b of the chip 100.

Solder bumps 214b are formed at the same location as one another on respective surfaces of the pads 213. The solder bumps 214b have substantially the same shape as one another. The solder bumps 214b are arranged at locations for connecting the respective peripheral terminals 111b of the chip 100.

An insulating film 215 is formed at a region other than the lands 212 and the pads 213 on the mounting side of the circuit substrate 200. Further, a planarizing treatment is carried out to planarize surfaces of the lands 212, the pads 213, and the insulating film 215.

At a circumferential portion of the mounting side, a solder resist 216 is so formed as to surround a periphery of the mounting region 200D at the slightly outer side of the mounting region 200D. An end at an outer circumferential side of each of the pads 213 is covered with the solder resist 216.

Figure 4:
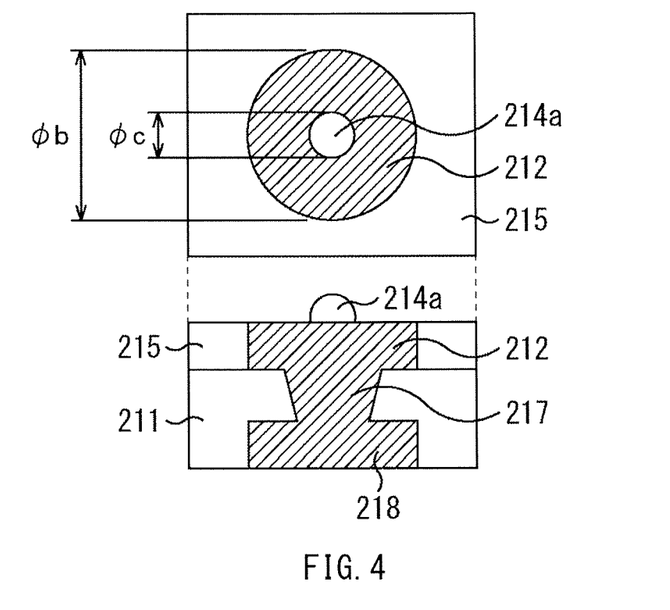
FIG. 4 is an enlarged view showing a region in the vicinity of a land on the circuit substrate.

FIG. 4 is an enlarged view showing a region in the vicinity of the land 212. More specifically, the upside drawing in FIG. 4 is a schematic diagram of the land 212 as viewed from topside, while the downside drawing is a schematic cross-sectional view of a region in the vicinity of the land 212.

The land 212 may be, for example, about 160 μm in diameter φb. Further, the solder bump 214a may take the substantially hemispherical shape, and may have a diameter φc of about 30 μm, for example.

At the bottom of each of the lands 212, there is provided a via hole 217. Each of the lands 212 is connected with a wiring pattern 218 that is formed at the backside of the base substrate 211 through the via hole 217.

Figure 5:
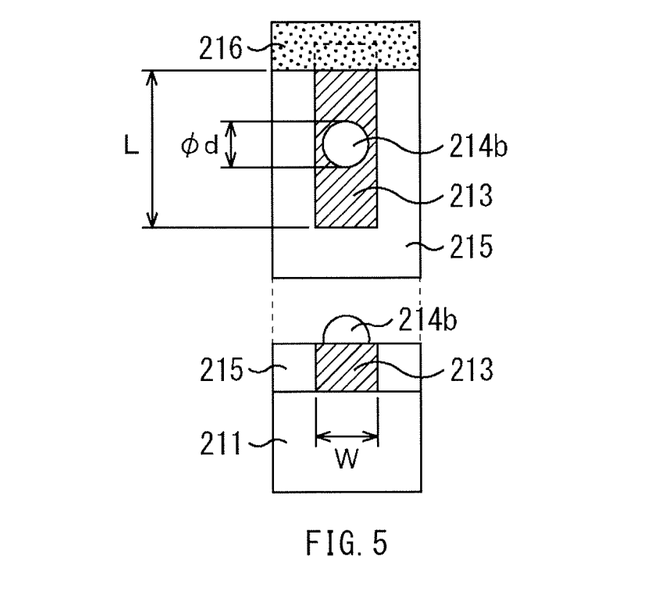
FIG. 5 is an enlarged view showing a region in the vicinity of a pad on the circuit substrate.

FIG. 5 is an enlarged view showing a region in the vicinity of the pad 213. More specifically, the upside drawing in FIG. 5 is a schematic diagram of the pad 213 as viewed from topside, while the downside drawing is a schematic cross-sectional view of a region in the vicinity of the pad 213.

A length L of a portion that is not covered with the solder resist 216 on a long side of the pad 213 may be, for example, about 130 μm. A width W of a narrow side of the pad 213 may be, for example, about 35 μm. Further, the solder bump 214b takes the same shape as the solder bump 214a of the land 212, and may have a diameter φd of about 30 μm, for example.

It is to be noted that each of the solder bump 214a and the solder bump 214b is hereinafter simply called a solder bump 214 in a case where it is not necessary to distinguish such solder bumps individually.

1-3. Configuration Example of Electronic Component 300

An electronic component 300 employing the present application, in one embodiment, is manufactured by mounting the chip 100 on the circuit substrate 200.

Figure 6:
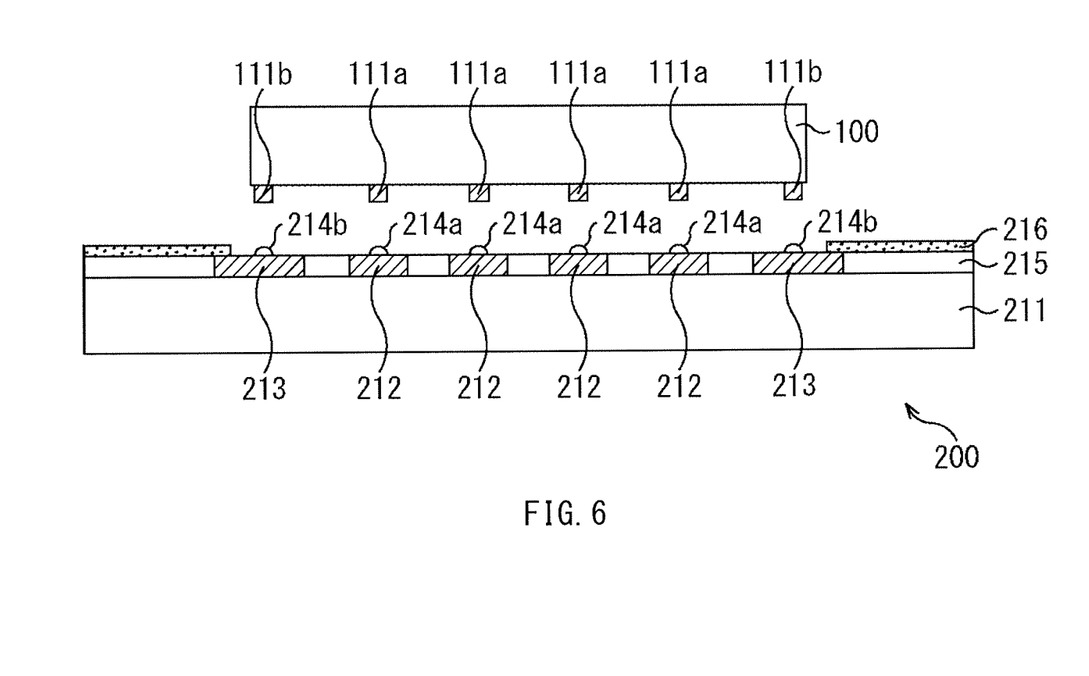
FIG. 6 is a schematic diagram showing connection locations between the chip and the circuit substrate.
Figure 7:
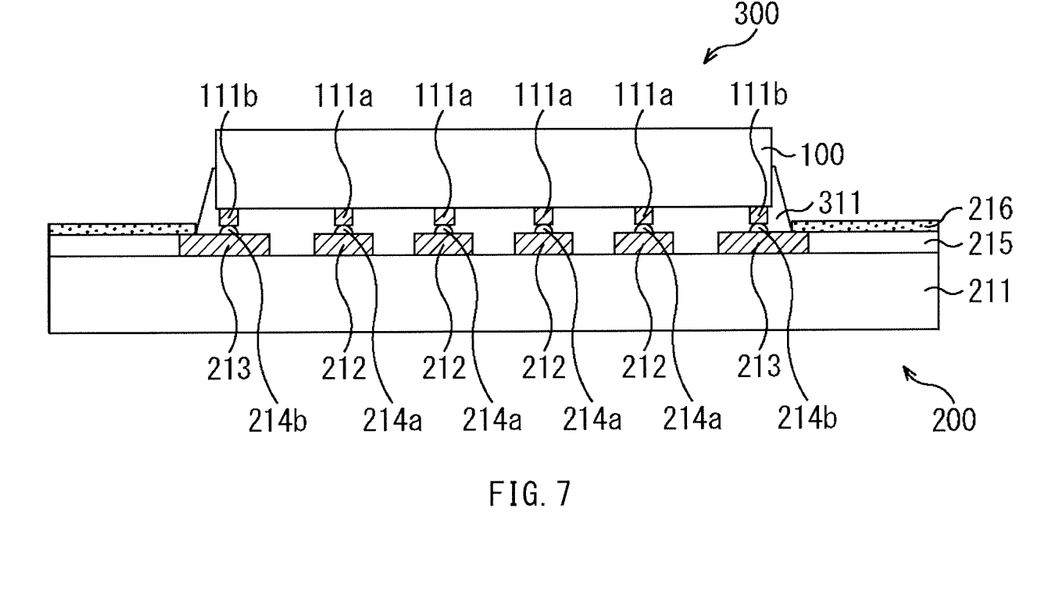
FIG. 7 is a schematic diagram showing a configuration example of an electronic component.

More specifically, as shown in FIG. 6, each of the terminals 111 of the chip 100 is mounted on the circuit substrate 200 in alignment with each of the solder bumps 214 of the circuit substrate 200. As shown in FIG. 7, this results in each of the terminals 111 of the chip 100 being connected with each of the solder bumps 214 of the circuit substrate 200.

On this occasion, for example, an underfill 311 may be coated on the mounting region 200D of the circuit substrate 200 prior to mounting of the chip 100, and thereafter the chip 100 may be mounted on the circuit substrate 200 using a flip-chip bonder. As a result, a clearance gap between the chip 100 and the circuit substrate 200 is filled and sealed with the underfill 311. The underfill 311 may be made of, for example, an activated epoxy resin with a flux functionality.

2. Method of Manufacturing Circuit Substrate 200

Next, with reference to FIG. 8 through FIG. 12, the description is provided on a method of manufacturing the circuit substrate 200, according to one embodiment.

Figure 8:
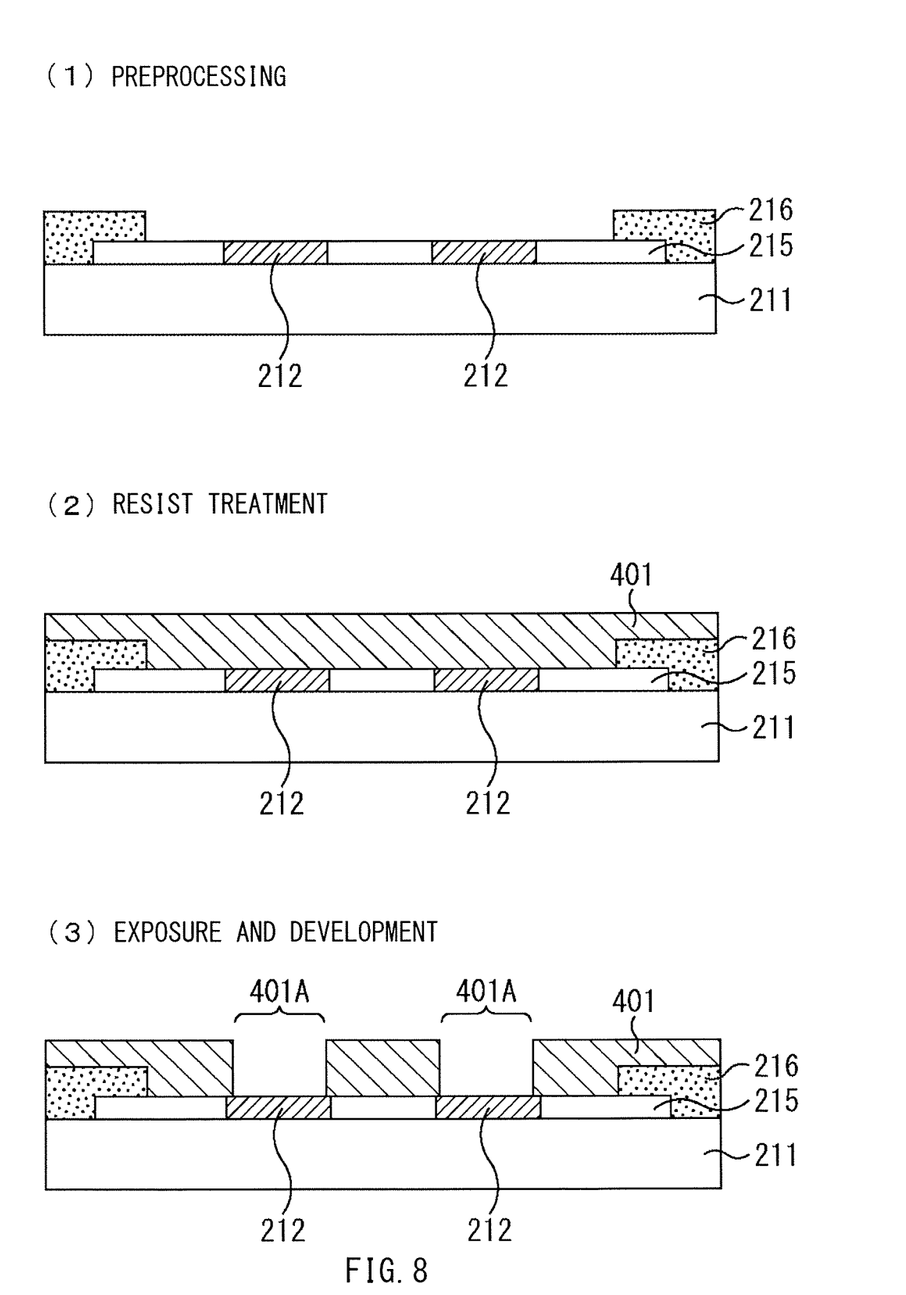
Figure 9:
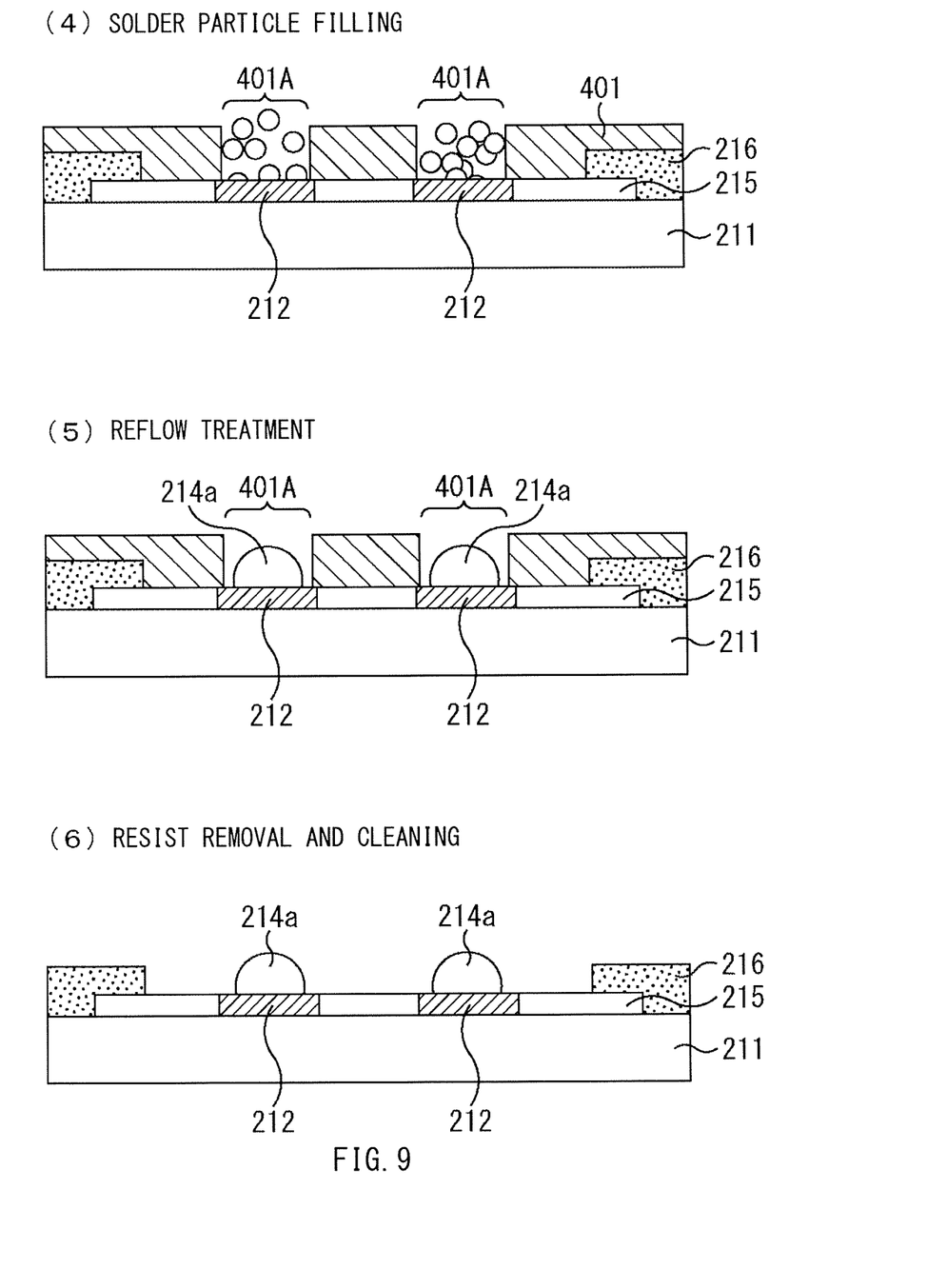

FIG. 8 and FIG. 9 show exemplary manufacturing steps for the circuit substrate 200. It is to be noted that, in the drawings in FIG. 8 and FIG. 9, the circuit substrate 200 is illustrated more schematically as compared with FIG. 3 for the purpose of simplifying the drawings. Further, an illustration for a step of forming the solder bump 214b on the pad 213 is omitted, although this may be practically formed using the same step as with the solder bump 214a on the land 212 as described later.

(1) Preprocessing Step

First, a planarizing treatment is carried out to planarize surfaces of the lands 212, the pads 213, and the insulating film 215 of the base substrate 211. Such a treatment uniforms heights of the lands 212, the pads 213, and the insulating film 215 to planarize the surface of the mounting region 200D.

Next, the solder resist 216 is so formed at a circumferential portion of the mounting side as to surround a periphery of the mounting region 200D at the slightly outer side of the mounting region 200D.

Figure 10:
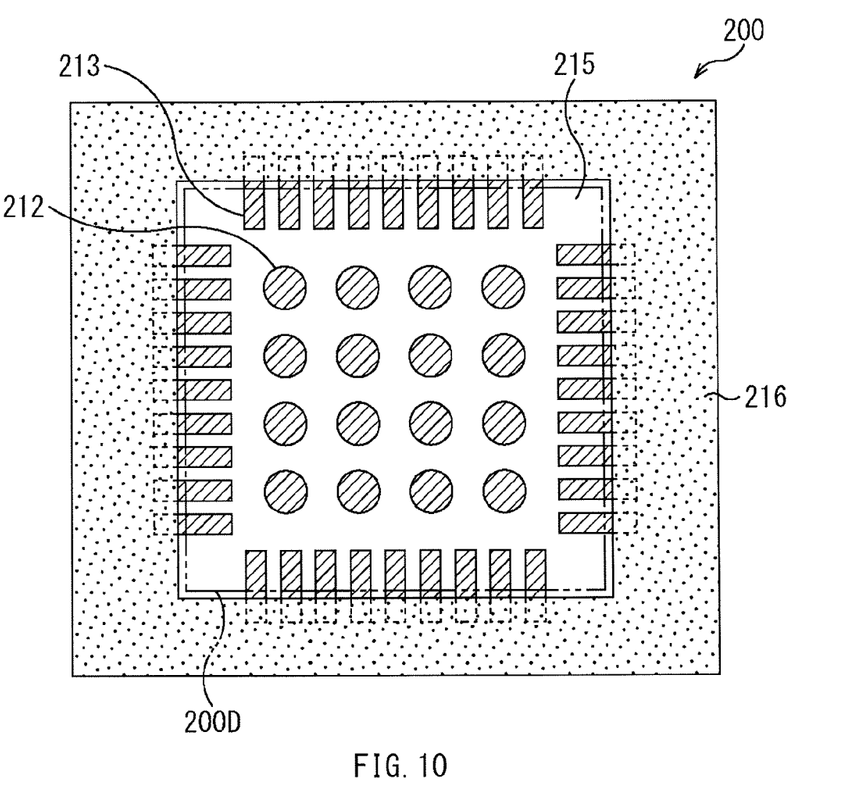
FIG. 10 is a top view schematically showing the circuit substrate for which a preprocessing step has been completed.

FIG. 10 is a top view schematically showing the circuit substrate 200 for which a preprocessing step has been completed. It is to be noted that reference numerals for the lands 212 and the pads 213 are omitted in part in the drawing for the purpose of simplifying the drawing.

(2) Resist Step

Subsequently, a resist 401 is coated or laminated over a whole surface of the mounting side of the circuit substrate 200. As a result, the surface of the mounting region 200D is covered with the resist 401. It is to be noted that the resist 401 may be configured of, for example, a photosensitive resin, and may be, for example, about 30 μm in thickness.

(3) Exposure and Development Step

Thereafter, an exposure and development step is carried out to form openings 401A and openings 401B (FIG. 11) on the resist 401.

Figure 11:
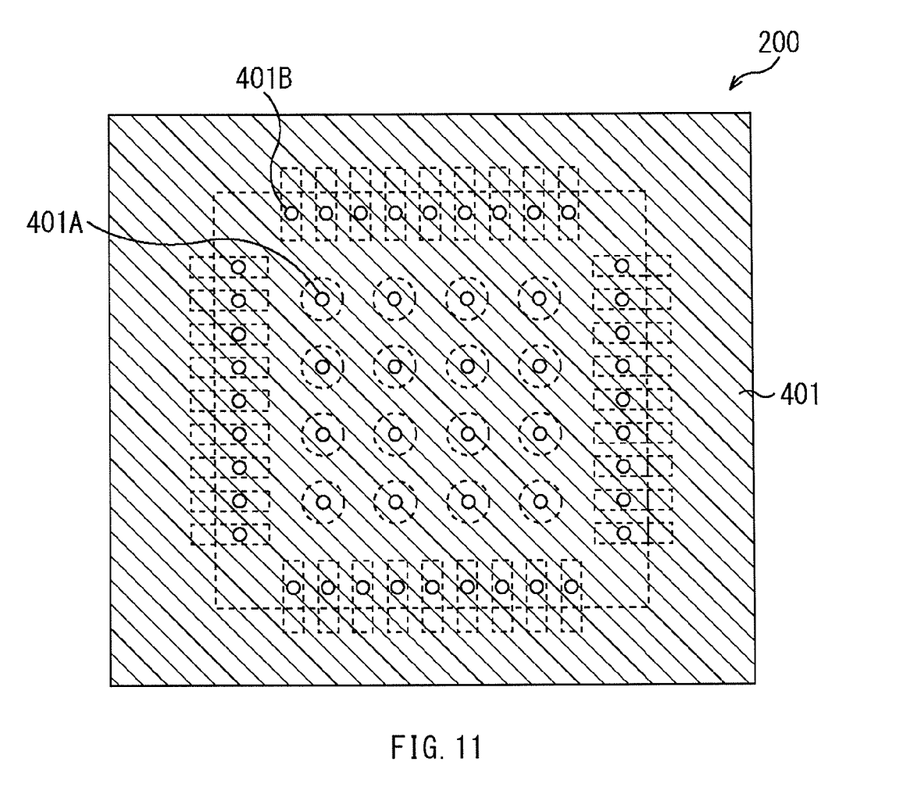
FIG. 11 is a top view schematically showing the circuit substrate for which an exposure and development step has been completed.

FIG. 11 is a top view schematically showing the circuit substrate 200 for which the exposure and development step has been completed. It is to be noted that reference numerals for the openings 401A and the openings 401B are omitted in part in the drawing for the purpose of simplifying the drawing.

The opening 401A and the opening 401B are circular openings that have the same shape as one another, and each may have a diameter of about 30 μm, for example. This diameter is equivalent to the diameter of each of the solder bump 214a and the solder bump 214b.

The openings 401A are formed in alignment with the connecting locations on the lands 212 where the respective area terminals 111a of the chip 100 are connected. This exposes a portion of each of the lands 212 where each of the area terminals 111a is connected, in other words, a portion where the solder bumps 214a are formed.

The openings 401B are formed in alignment with the connecting locations on the pads 213 where the respective peripheral terminals 111b of the chip 100 are connected. This exposes a portion of each of the pads 213 where each of the peripheral terminals 111b is connected, in other words, a portion where the solder bumps 214b are formed.

(4) Solder Particle Filling Step

Next, substantially the same amount of powdery solder particles is filled into each of the openings 401A and the openings 401B of the resist 401.

Figure 12:
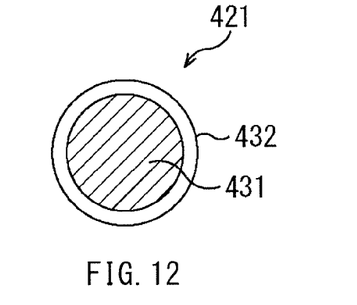
FIG. 12 is a schematic diagram showing a cross-sectional surface of a solder particle.

FIG. 12 schematically shows a cross-sectional surface of a solder particle 421. The solder particle 421 has a configuration in which a surface of a substantially spherical solder (Sn3Ag0.5Cu) 431 is coated with a flux (for example, rosin). A diameter of the solder particle 421 is smaller than the diameter of each of the opening 401A and the opening 401B. For example, a diameter of the solder 431 may be about 10 μm, and a thickness of a coat 432 may be about 2 μm. Further, the solder 431 is a solid monomer at ambient temperature, while the solder particle 421 is tack-free at ambient temperature.

(5) Reflow Step

Subsequently, a reflow is carried out under the nitrogen atmosphere. This heats the whole circuit substrate 200 to melt the solder particles 421 within the openings 401A and openings 401B, and the solder bumps 214a and the solder bumps 214b that take substantially the same shape as one another are formed in the openings 401A and openings 401B, respectively.

(6) Resist Removal and Cleaning Step

Thereafter, the resist 401 is completely removed. For example, amine-based peeling solution may be used for removal of the resist 401. Such a resist removal step exposes the whole mounting region 200D. Further, flux residues and the like resulting from the solder particles 421 are cleaned out.

With such steps, it is possible to manufacture the above-described circuit substrate 200 as shown in FIG. 3, and to form the solder bumps 214 that have substantially the same shape as one another on the patterns of the circuit substrate 200 that have different shapes from one another (such as the lands 212 and the pads 213, in which the lands 212 are different in shape from the pads 213). Further, the surface of the mounting region 200D of the circuit substrate 200 is planarized, which makes it possible to uniform the height of each of the solder bumps 214.

Additionally, it is possible to improve the positional accuracy for forming the solder bumps 214 as compared with a currently-available method of opening a solder resist with a laser machining to print a cream solder, or any other method, and to precisely align a position of each solder bump 214 with a connecting position for each of the terminals 111 on the chip 100. Further, it is also possible to suppress occurrence of defects that may take place in existing methods, such as drop-off of the solder bumps and short-circuiting of the adjacent solder bumps.

Accordingly, in performing a flip-chip mounting of the chip 100 on the circuit substrate 200, it is possible to ensure connection of the respective terminals 111 of the chip 100 and the solder bumps 214 of the circuit substrate 200. Further, it is also possible to mount the chip 100 on the circuit substrate 200 at reduced load, as well as to prevent the base substrate 211 and the like from being damaged even though the via holes 217 are formed beneath the lands 212. As a result, this makes it possible to suppress occurrence of defects in the electronic component 300, thereby allowing to improve the quality.

3. Modification Examples

Hereinafter, the description is provided on modification examples for the above-described embodiment of the present application.

3-1. Modification Example of Manufacturing Step

For example, in manufacturing the circuit substrate 200, a reflow step may be carried out under the reduction atmosphere filled with hydrogen, formic acid, and the like. This eliminates the necessity of coating the surfaces of the solder particles using a flux.

3-2. Modification Example of Patterns for Forming Solder Bumps

Further, the above-described shapes of the patterns (lands 212 and pads 213) of the circuit substrate 200 are taken as an example, and are not limited thereto. Types of pattern shapes are also not limited to the two types as described above, and the present application may be applicable in the case of one type, or three or more types as well. In addition, according to embodiments of the present application, it is possible to form with high accuracy the solder bumps that have substantially the same shape as one another at predetermined positions without depending on patterns that are exposed on the circuit substrate.

3-3. Modification Example of Shapes and Dimensions of Terminals 111, Solder Bumps 214, and the Like Moreover, the above-described shapes and dimensions of the terminals 111 of the chip 100, the solder bumps 214, the openings 401A and 401B of the resist 401, solder particles 421, and the like are taken as an example, and they may be modified as appropriate. For example, the above description exemplifies a case where the diameter of each of the terminals 111 of the chip 100 is made equal to the diameter of the solder bump 214, although the diameter of each of the terminals 111 may be made larger or smaller than the diameter of the solder bump 214.

Furthermore, the technology encompasses any possible combination of some or all of the various embodiments described herein and incorporated herein.

It is possible to achieve at least the following configurations from the above-described example embodiments of the disclosure.

(1) A circuit substrate, including:
a mounting region having an exposed surface that is planarized, and in which a predetermined chip is to be mounted;
patterns provided in the mounting region, and including respective top faces that form a part of the exposed surface; and
solder bumps provided on the respective patterns, and having substantially same shape as one another.

(2) The circuit substrate according to (1), wherein the circuit substrate is manufactured by:
planarizing a surface of the mounting region;
covering the mounting region with a resist;
forming openings on the resist in alignment with respective locations on the patterns where respective terminals of the chip are to be connected, the openings having same shape as one another;
filling solder particles into the openings, the solder particles each having a diameter that is smaller than a diameter of each of the openings;
melting the solder particles to form the solder bumps in the openings; and
removing the resist.

(3) The circuit substrate according to (1) or (2), further including a solder resist provided at a circumferential portion of a mounting side of the circuit substrate to surround a periphery of the mounting region.

(4) A method of manufacturing a circuit substrate, the method including:
planarizing a surface of a mounting region in which a predetermined chip is to be mounted to expose top faces of respective patterns in the mounting region;
covering the mounting region with a resist;
forming openings on respective portions, of the resist, that cover the respective patterns, the openings having same shape as one another;
filling solder particles into the openings, the solder particles each having a diameter that is smaller than a diameter of each of the openings;
melting the solder particles to form the solder bumps in the openings; and
removing the resist.

(5) The method of manufacturing the circuit substrate according to (4), wherein surfaces of the solder particles are coated with a flux, and the melting the solder particles is carried out under a nitrogen atmosphere.

(6) An electronic component provided with a chip and a circuit substrate, the chip being provided with terminals, and the circuit substrate being mounted with the chip, the circuit substrate including:
a mounting region having an exposed surface that is planarized, and in which a predetermined chip is mounted;
patterns provided in the mounting region, and including respective top faces that form a part of the exposed surface; and
solder bumps provided on locations, on the respective patterns, that correspond to the respective terminals of the chip, and having substantially same shape as one another.

(7) The electronic component according to (6), wherein the circuit substrate is manufactured by:
planarizing a surface of the mounting region;
covering the mounting region with a resist;
forming openings on the resist in alignment with the respective locations on the patterns, the openings having same shape as one another;
filling solder particles into the openings, the solder particles each having a diameter that is smaller than a diameter of each of the openings;
melting the solder particles to form the solder bumps in the openings; and
removing the resist.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A circuit substrate, comprising:
a mounting region that has an exposed surface that is planarized, wherein the mounting region is configured to mount a chip;
a plurality of circular land surfaces present at a center section of the mounting region;
a plurality of first solder bumps at center portions of the plurality of circular land surfaces, wherein the plurality of first solder bumps have same shape, and wherein each of the plurality of first solder bumps has a smaller diameter than each of the plurality of circular land surfaces; and
a plurality of pads arranged at determined spacing intervals along each side of a peripheral section of the mounting region, wherein the plurality of pads surrounds the plurality of circular land surfaces along the peripheral section, and wherein a plurality of second solder bumps are on respective surfaces of the plurality of pads.

2. The circuit substrate according to claim 1, wherein the circuit substrate is manufactured by:
planarizing a surface of the mounting region;
covering the mounting region with a resist;
forming a plurality of openings on the resist in alignment with respective locations on the plurality of circular land surfaces in the mounting region where respective terminals of the chip are to be connected, wherein the plurality of openings have same shape;
filling solder particles into the plurality of openings, wherein each of the solder particles has a first diameter that is smaller than a second diameter of each of the plurality of openings;
melting the solder particles to form the plurality of first solder bumps in the plurality of openings; and
removing the resist.

3. The circuit substrate according to claim 1, further comprising a solder resist at a circumferential portion of a mounting side of the circuit substrate to surround a periphery of the mounting region.

4. An electronic component, comprising:
a chip and a circuit substrate, wherein the chip includes terminals, and the circuit substrate is mounted with the chip, the circuit substrate comprising:
a mounting region that has an exposed surface that is planarized, wherein the mounting region is configured to mount the chip;
a plurality of circular land surfaces present at a center section of the mounting region;

a plurality of first solder bumps at center portions of the plurality of circular land surfaces, wherein positions of the plurality of first solder bumps correspond to respective terminals of the chip, wherein the plurality of first solder bumps have same shape, and wherein each of the plurality of first solder bumps has a smaller diameter than each of the plurality of circular land surfaces; and a plurality of pads arranged at determined spacing intervals along each side of a peripheral section of the mounting region, wherein the plurality of pads surrounds the plurality of circular land surfaces along the peripheral section, and wherein a plurality of second solder bumps are on respective surfaces of the plurality of pads.

5. The electronic component according to claim 4, wherein the circuit substrate is manufactured by:
planarizing a surface of the mounting region;
covering the mounting region with a resist;
forming a plurality of openings on the resist in alignment with respective locations on the plurality of circular land surfaces in the mounting region, wherein the plurality of openings have same shape;
filling solder particles into the plurality of openings, wherein each of the solder particles has a first diameter that is smaller than a second diameter of each of the plurality of openings;
melting the solder particles to form the plurality of first solder bumps in the plurality of openings; and
removing the resist.

6. The circuit substrate according to claim 1, wherein the plurality of first solder bumps and the plurality of second solder bumps have substantially same shape.

7. The circuit substrate according to claim 1, wherein each of the plurality of first solder bumps is arranged inside a corresponding circular land surface of the plurality of circular land surfaces.

\* \* \* \* \*